United States Patent [19]
Kojima et al.

[11] Patent Number: 6,107,163
[45] Date of Patent: Aug. 22, 2000

[54] METHOD OF MANUFACTURING A SEMICONDUCTOR CHIP

[75] Inventors: Yoshikazu Kojima; Masaaki Kamiya, both of Chiba, Japan

[73] Assignee: Seiko Instruments Inc., Japan

[21] Appl. No.: 09/081,987

[22] Filed: May 20, 1998

[51] Int. Cl.[7] .................................................. H01L 21/46
[52] U.S. Cl. ......................... 438/464; 438/460; 438/462
[58] Field of Search .................................... 438/460, 462, 438/464; 125/12, 16.01

[56] References Cited

U.S. PATENT DOCUMENTS

| | | | |
|---|---|---|---|
| 3,478,732 | 11/1969 | Clark et al. ................................. | 125/12 |
| 5,266,528 | 11/1993 | Yamada ..................................... | 438/464 |
| 5,314,844 | 5/1994 | Imamura ................................... | 438/460 |
| 5,358,590 | 10/1994 | Yamanaka ................................ | 438/464 |
| 5,362,681 | 11/1994 | Roberts, Jr. et al. .................... | 438/464 |
| 5,609,148 | 3/1997 | Mitwalsky et al. .................. | 120/16.01 |
| 5,824,177 | 10/1998 | Yoshihara et al. ...................... | 438/460 |
| 5,904,546 | 5/1999 | Wood et al. ............................. | 438/464 |

*Primary Examiner*—Kevin M. Picardat
*Attorney, Agent, or Firm*—Adams & Wilks

[57] ABSTRACT

In a method of manufacturing a semiconductor chip, a wire is traveled in one way to cut a wafer into a plurality of chips while a wire train where wires are arranged by pitches of scribe lines is brought into contact with the scribe lines of the wafer linearly, and an abrasive solution is supplied to a contact portion thereof.

20 Claims, 4 Drawing Sheets

METHOD OF MANUFACTURING A SEMICONDUCTOR CHIP

BACKGROUND OF THE INVENTION

The present invention relates to a method of manufacturing a semiconductor chip in which a wafer having a semiconductor region on a surface thereof is diced so as to be divided into a plurality of chip.

FIGS. 2A and 2B are diagrams showing a conventional dicing process using an outer peripheral blade saw. FIG. 2A is a cross-sectional view of the conventional dicing process, and FIG. 2B is a perspective view thereof.

A wafer 3 on which a semiconductor integrated circuit is patterned is disposed on a dicing table 4 through an adhesive tape 1. The wafer 3 adheres to the adhesive tape 1. The adhesive tape 1 is adsorbed by the dicing table 4 under a vacuum. The adhesive tape 1 is extended between ring-shaped frames 2. A dicing saw 6 is made up of a fred having diamond abrasive grains fixed onto an outer peripheral portion of a doughnut-shaped metal disc. The dicing saw 6 scribes the wafer 3 in such a manner that the dicing saw 6 is moved along a scribe line in a rotating direction while it is rotated at high speed in a direction C and is perpendicularly brought in contact with a plane of the wafer 3. After one scribe line is scribed, the table 4 is moved in a direction A by a pitch length of the scribe lines, and then a succeeding scribe line is scribed in the same manner. Cut grooves are formed in the wafer through scribing. The respective scribe lines are sequentially scribed into cut grooves 20-1, 20-2 ... 20-7 one by one, thus cutting all of the scribe lines in an X-direction. Then, the table 4 is rotated at 90°, and scribe lines in a Y-direction are sequentially cut into cut grooves 21-1, 21-2, ... one by one in the same manner.

All of the scribe lines in the X-direction and the Y-direction are cut so that an integrated circuit formed inside of the scribe lines is divided into a plurality of chips.

However, the conventional method of manufacturing the semiconductor chip suffers from problems stated below.

(1) Because the diamond abrasive grains fixed onto a blade in the outer peripheral blade saw are severely worn out, the blade must be frequently replaced by a new one. Also, because a cut-into speed must be made low, the cutting efficiency is remarkably low.

(2) Because the thickness of the blade is thick, between 30 to 50 $\mu$m, the width of the scribe line increases to about 100 $\mu$m. Because the width of the scribe line region is large, the number of intergrated circuits patterned on the surface of the wafer cannot be increased. That is, the chip costs are increased.

(3) In the case of dicing by the outer-peripheral blade saw, a broken portion is produced on the wafer in the vicinity of the cut surface. Also, because a length of the broken portion is long, a distance between the scribe line and a transistor of the integrated circuit must be made long. Therefore, the size of the integrated circuit is increased with the result that the chip costs cannot be lowered.

SUMMARY OF THE INVENTION

The present invention has been made to solve the above problems, and therefore an object of the present invention is to provide a method of manufacturing a semiconductor chip which is capable of improving the scribe efficiency and lowering the costs of the chip with a reduction in the width of the scribe line and a reduction in the size of the integrated circuit.

In order to solve the above problems with the prior art, according to the present invention, there is provided a method of manufacturing a semiconductor chip in which a wafer having a semiconductor region on a surface thereof is diced so as to be divided into a plurality of chips, comprising the steps of: forming a plurality of integrated circuits on the surface of the wafer in the form of a lattice through the respective scribe lines as an integrated circuit printing step; adhering a tape onto a back surface of the wafer as a chip support step; and dicing the wafer by moving a wire along the scribe lines while the wire is in contact with the scribe line as a wafer dicing step.

Also, in the method of manufacturing a semiconductor chip, the above wafer dicing step is conducted while the wire is in contact with the respective scribe lines in a plurality of columns.

The above and other objects and features of the present invention will be more apparent from the following description taken in conjunction with the accompanying drawings.

DETAILED DESCRIPTION OF THE PREFERRED EMBODIMENTS

Now, a description will be given in more detail of preferred embodiments of the present invention with reference to the accompanying drawings.

According to the present invention, there is provided a method of manufacturing a semiconductor chip in which a wire is traveled in one way to cut a wafer into a plurality of chips while a wire train where wires are arranged by pitches of scribe lines are brought in contact with the scribe lines of the wafer linearly, and an abrasive solution is supplied to a contact portion thereof.

Figure 1:
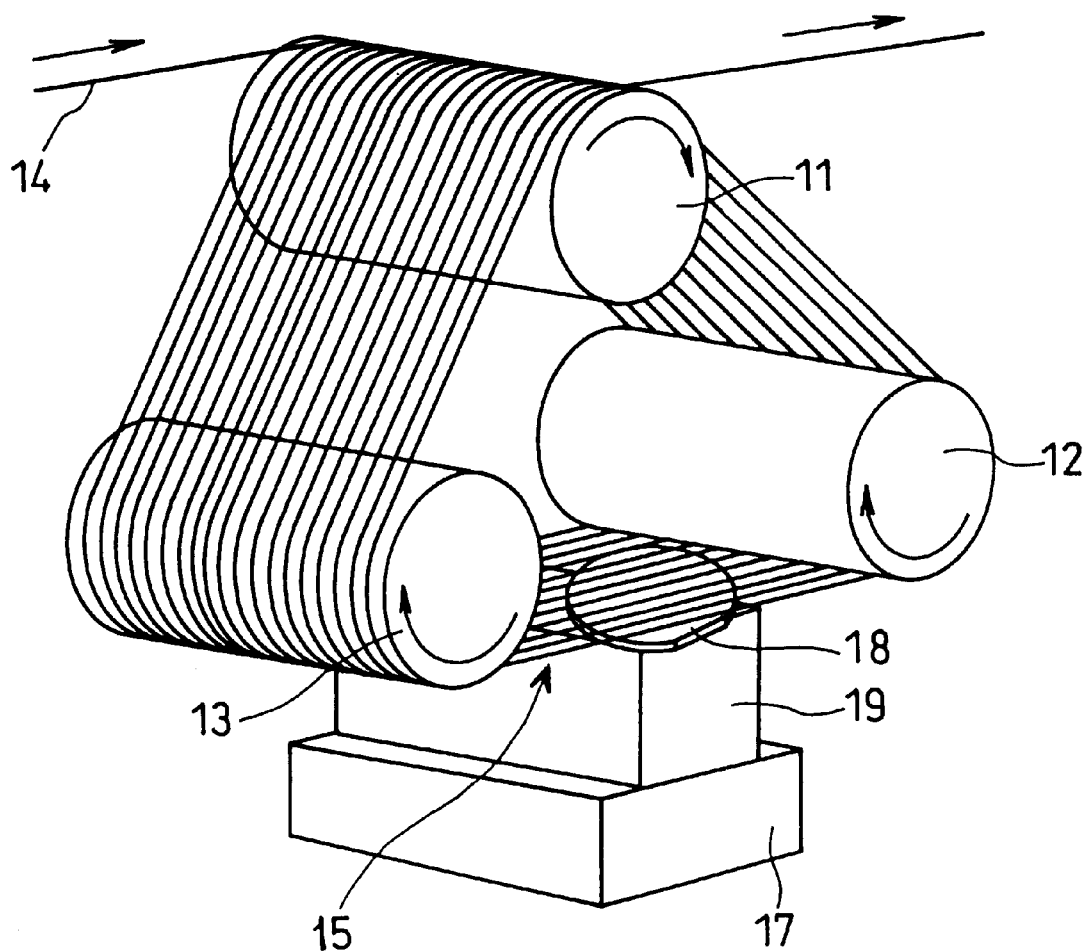
FIG. 1 is a schematic diagram showing a scribing process according to the present invention.
Figure 2A:
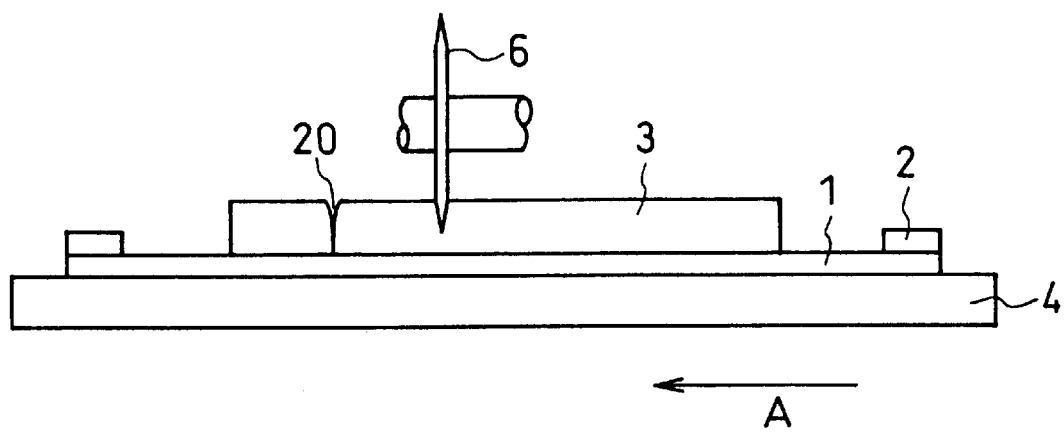
FIG. 2A is a cross-sectional view showing a scribing step in a conventional dicing saw.
Figure 2B:
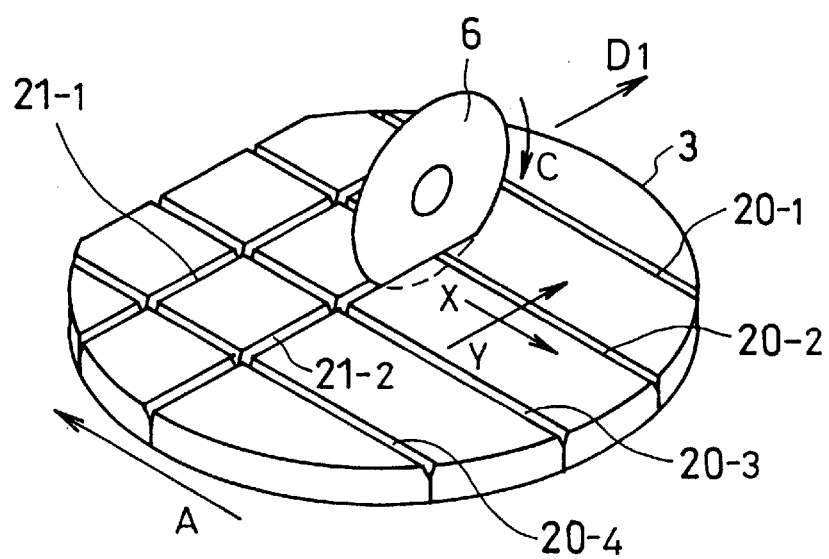
FIG. 2B is a perspective view showing a scribe step in the conventional dicing saw.

FIG. 1 is a schematic diagram showing one example of a scribing process in a method of manufacturing a semiconductor chip according to the present invention. Before chipping a wafer, a plurality of integrated circuits are patterned on a surface of the wafer in the form of a matrix. Scribe lines are defined between the respective integrated circuits in the form of a lattice. A wafer 18 as patterned is located on a wafer support table 17. The wafer 18 is usually located on the wafer support table 17 through a dummy plate 19. Then, the wafer is scribed by a wire saw.

Reference numerals 11, 12 and 13 in FIG. 1 denote multi-groove rollers, 14 is a wire, and 15 is a wire train. A single wire 14 is wound in a large number of grooves defined in an outer periphery of three multi-groove rollers 11, 12 and 13 which are held in a rotating body. The wire train 15 having pitches of the scribe lines is formed, and at least one multi-groove roller is rotationally driven to travel the wire train in a rotating direction. A machining solution is supplied to the surface of the wafer. A boron carbide abrasive solution or the like is used as the machining solution. The wire train 15 is displaced in contact with the respective scribe lines so that the wafer is divided into a plurality of chips. Since the wafer is scribed by the wire saw having a small-diameter wire, a cut width can be thinned more than that in the case of using the conventional outer-peripheral blade saw. Since the cut width can be thinned, the scribe line width of the wafer can be narrowed, thereby being capable of increasing the number of chips cut from the wafer. Also, because the wafer is scribed while the machining solution is supplied to the surface of the wafer, it is difficult to produce a broken portion on the machining surface. Therefore, a distance between the scribe line and a transistor of the integrated circuit can be shortened. This enables the size of the integrated circuit to be reduced. Also, in case of the wire saw, the exchange of the wire can be performed during the scribing process by the application of a manner in which the wire is wound up on another reel in one way.

This prevents the productivity from being lowered due to the interruption of the scribing process during the exchange of the wire. Also, the respective scribe lines are scribed in the wire train at the same time, thereby being capable of reducing the scribing time. Further, in case of the wire saw, the wire saw scribes the wafer linearly. Therefore, a displacement of alignment of the wire saw and the scribe line is little to the degree that the scribe line width can be further thinned.

Figure 3:
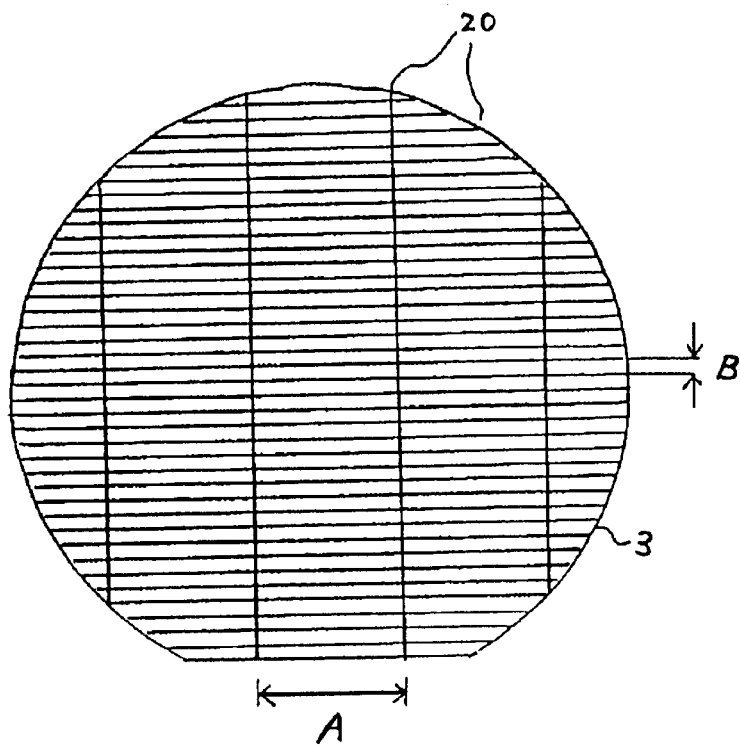
FIG. 3 is a plan view showing a wafer suitable for a manufacturing method of the present invention.

The method of manufacturing the semiconductor chip according to the present invention is suitable for machining of an integrated circuit very long in the scribe line as shown in FIG. 3. FIG. 3 is a plan view showing the wafer 3 on the surface of which the integrated circuit has been patterned. On the surface of the wafer, chips A×B in size are printed in the form of a lattice through longitudinal and lateral scribe lines 20. As in the chip shown in FIG. 3, in the integrated circuit long in chip peripheral length with respect to the chip area, the entire area of the scribe lines with respect to the wafer surface becomes large. In other words, the number of chips per wafer cannot be increased in proportion to the chip size. According to the manufacturing method of the present invention, in the thin chip shown in FIG. 3, the number of chips within the wafer can be increased in correspondence with the chip size. For example, in a chip which is very slender to the degree of A/B≧16, the length of the scribe line becomes twice or more as long as that in a chip with the number of chips being A=B. Therefore, according to the manufacturing method of the present invention, in the chip form of A/B≧16, the effect of greatly deleting the useless area of the scribe lines can be exhibited.

Figure 4:
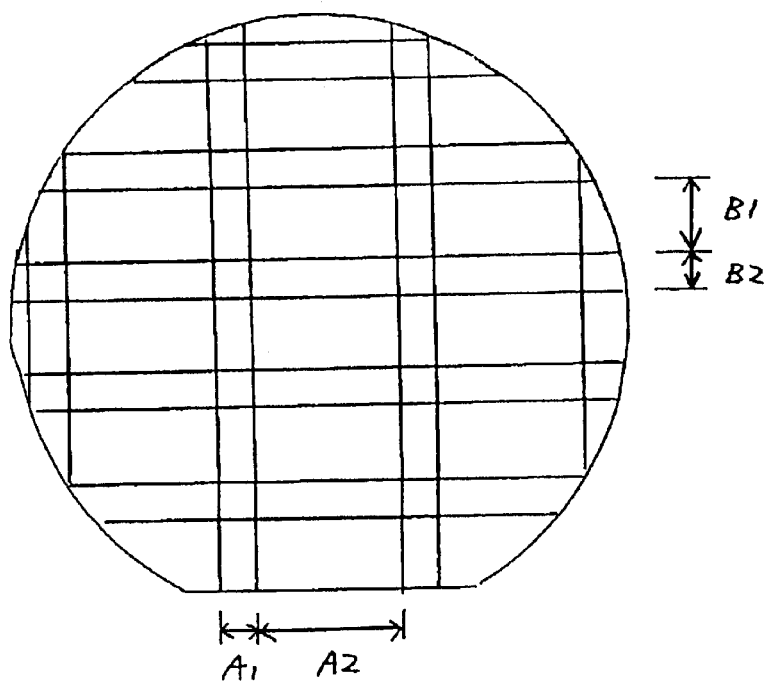
FIG. 4 is a plan view showing a wafer in a manufacturing method according to another embodiment of the present invention.

Also, according to the manufacturing methods of the present invention, as shown in FIG. 4, it is also effective to a wafer on which integrated circuits having plural kinds of chip sizes are printed. With setting of the wire cycle for each of the chip sizes, chips with a plurality of chip sizes can be scribed at the same time. In an embodiment shown in FIG. 4, four kinds of integrated circuits of $A_1 \times B_1, A_1 \times B_2, A_2 \times B_1$, and $A_2 \times B_2$ are printed on the surface of the wafer.

Figure 5:
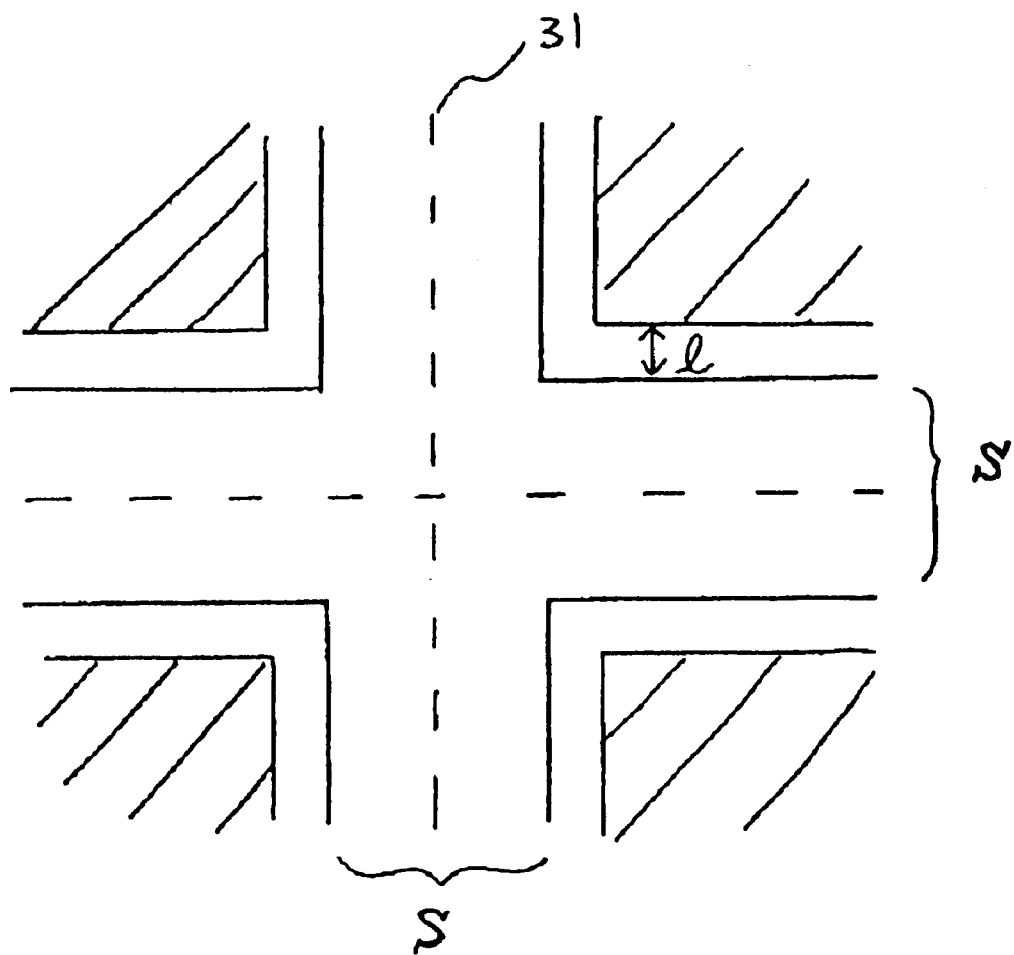
FIG. 5 is an enlarged plan view showing a chip end portion within a wafer which is machined according to the manufacturing method of the present invention.

Further, according to the method of manufacturing a semiconductor device of the present invention, the scribe line can be thinned more than that of the conventional method. Therefore, in the integrated circuit small in chip size, there is an advantage that the number of integrated circuits cut from the wafer is increased. Assuming that the chip size can be decreased by the existing scribe line width, the number of chips that is twice as many as those in the existing manufacturing method can be obtained in case of a square chip a chip width of which is 0.41 mm, and also in case of an extremely thin chip a chip width of which is 0.24 mm or less. In other words, in the manufacturing method of the present invention, the chip costs can be reduced to half of the conventional costs. In the manufacturing method of the present invention, the scribe line width cannot be reduced to 0 μm. However, because a damage on the wafer at the cut surface can be reduced, a distance between the scribe end surface (i.e., the side edge of the diced chip) and the transistor of the integrated circuit can be reduced. FIG. 5 is an enlarged plan view showing an end portion of the integrated circuit. A center of a dicing saw or a wire is in contact with a scribe center line 31 when cutting the wafer. Taking a displacement of the widths of the dicing saw and the wire into consideration, a scribe line region S is provided. A distance 1 between a scribe region and a transistor region (an oblique-line portion) is provided in view of an influence of scribing. According to the chip machining by the wire saw of the present invention, the width of the scribe region S and the distance 1 can be shortened more than the conventional ones. An improvement of 120 μm or more can be made for both of the width of the scribe region S and the distance 1. According to the manufacturing method of the present invention, a distance between the scribe end portion and the transistor region can be reduced to 3 μm or less.

From FIGS. 3, 4 and 5, the present invention is suitable for a reduction of the costs of the semiconductor integrated circuits and has the benefits stated below.

(1) An integrated circuit very small in chip size. Specifically, the present invention is suitable for an integrated circuit 0.41 mm or less in the length of shorter sides thereof.

(2) An integrated circuit slender in chip configuration. Specifically, the present invention is suitable for an integrated circuit the shorter sides of which are 16 times or more as long as the longer sides thereof.

(3) A chip in which the transistor region is very close to the scribe. As a specific embodiment, the present invention is suitable for an integrated circuit (hereinafter referred to as "active pad integrated circuits") in which a pad electrode (an external connection terminal) is disposed on the transistor region.

(4) An active pad integrated circuit very small in chip. The present invention is suitable for a chip the shorter sides of which are 0.41 mm or less.

(5) An integrated circuit very small in chip and slender. Specifically, a chip configured such that shorter sides thereof are 0.41 mm or less and 16 times or more as long as longer sides thereof.

(6) An active pad integrated circuit slender in chip. Specifically, a chip configured such that longer sides of the chip are 16 times or more as long as shorter sides thereof.

The external connection terminal of the active pad integrated circuit may be a wire bonding, a bump structure or the like. In particular, the bump structure is suitable for the present invention because damage to the transistor is small, and the pad is freely disposed.

The machining solution for enhancing the scribe efficiency is generally silicon carbide. There is used silicon carbide mixed with oil such as lapping oil or liquid such as water containing an appropriate additive therein. Compared with silicon carbide, boron carbide has an effect that scribing is enabled with a shorter time.

As was described above, the present invention has the following advantages.

(1) The scribing time can be shortened.

(2) Because the number of chips cut from the wafer can be increased with a reduction in the scribe line width and a reduction in the integrated circuit, the costs of the chip can be lowered.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A method of manufacturing semiconductor chips on a wafer having a semiconductor region on a surface thereof, comprising the steps of:

forming a plurality of integrated circuits on the surface of the wafer in the form of a lattice through respective scribe lines;

adhering a tape onto a back surface of the wafer to support chips diced from the wafer; and dicing the wafer into a plurality of chips having opposed sides which have a length of 0.41 mm or less by moving a wire along the scribe lines while the wire is in contact with the scribe lines.

2. A method as claimed in claim 1, wherein the dicing step is conducted while the wire is in contact with the respective scribe lines in a plurality of columns.

3. A method as claimed in claim 1, wherein the diced chips have a longer side which is at least 16 times longer than a shorter side thereof.

4. A method of manufacturing semiconductor chips, comprising the steps of:

providing a wafer having a matrix of semiconductor integrated circuits formed on a front surface thereof, the semiconductor integrated circuits being formed in rows and columns and being separated from one another by spaces defining rows and columns of scribe lines;

adhering a tape onto a back surface of the wafer; and dicing the wafer into semiconductor chips comprised of the semiconductor integrated circuits adhered to and supported on the tape by moving one or more wires simultaneously along the rows of scribe lines in contact with the wafer and simultaneously along the columns of scribe lines in contact with the wafer while supplying a machining solution to the wafer front surface.

5. A method according to claim 4; wherein the semiconductor chips have a pair of opposed first sides and a pair of opposed second sides, the first sides being at least 16 times longer than the second sides.

6. A method according to claim 5; wherein the second sides have a length of 0.41 mm or less.

7. A method according to claim 5; wherein the second sides have a length of 0.24 mm or less.

8. A method according to claim 5; wherein a distance between a side edge of the diced semiconductor chips and a transistor region of the semiconductor chips is 3 $\mu$m or less.

9. A method according to claim 5; wherein a distance between a side edge of the diced semiconductor chips and the integrated circuits formed thereon is 3 $\mu$m or less.

10. A method according to claim 4; wherein the semiconductor chips have a pair of opposed first sides and a pair of opposed second sides, at least one of the first and second sides having a length of 0.41 mm or less.

11. A method according to claim 10; wherein at least one of the first and second sides has a length of 0.24 mm or less.

12. A method according to claim 10; wherein a distance between a side edge of the diced semiconductor chips and a transistor region of the semiconductor chips is 3 $\mu$m or less.

13. A method according to claim 10; wherein a distance between a side edge of the diced semiconductor chips and the integrated circuits formed thereon is 3 $\mu$m or less.

14. A method according to claim 4; wherein the dicing step is carried out by a wire train having plural lengths of wire for simultaneously dicing the wafer along the rows and along the columns of scribe lines.

15. A method according to claim 14; wherein the machining solution comprises a boron carbide abrasive solution.

16. A method according to claim 14; wherein the machining solution comprises a silicon carbide abrasive solution.

17. A method according to claim 14; wherein the semiconductor chips have a pair of opposed first sides and a pair of opposed second sides, the first sides being at least 16 times longer than the second sides.

18. A method according to claim 17; wherein the second sides have a length of 0.41 mm or less.

19. A method according to claim 17; wherein the second sides have a length of 0.24 mm or less.

20. A method according to claim 14; wherein a distance between a side edge of the diced semiconductor chips and the integrated circuits formed thereon is 3 $\mu$m or less.

* * * * *